(12) United States Patent
Kim et al.

(10) Patent No.: US 11,876,083 B2
(45) Date of Patent: Jan. 16, 2024

(54) SEMICONDUCTOR PACKAGE

(71) Applicant: Samsung Electronics Co., Ltd., Suwon-si (KR)

(72) Inventors: Dongho Kim, Daegu (KR); Ji Hwang Kim, Cheonan-si (KR); Hwan Pil Park, Hwaseong-si (KR); Jongbo Shim, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 201 days.

(21) Appl. No.: 17/407,647

(22) Filed: Aug. 20, 2021

(65) Prior Publication Data

US 2022/0173082 A1 Jun. 2, 2022

(30) Foreign Application Priority Data

Nov. 30, 2020 (KR) .................. 10-2020-0164363

(51) Int. Cl.
| | | |
|---|---|---|
| *H01L 23/02* | (2006.01) | |
| *H01L 25/10* | (2006.01) | |
| *H01L 25/065* | (2023.01) | |
| *H01L 21/48* | (2006.01) | |

(52) U.S. Cl.
CPC ........ *H01L 25/105* (2013.01); *H01L 21/4882* (2013.01); *H01L 25/0655* (2013.01); *H01L 2225/1035* (2013.01); *H01L 2225/1041* (2013.01); *H01L 2225/1058* (2013.01); *H01L 2225/1094* (2013.01)

(58) Field of Classification Search
CPC ......... H01L 21/4882; H01L 2225/1094; H01L 2225/1035; H01L 2225/1041

USPC ....................................................... 257/686
See application file for complete search history.

(56) References Cited

U.S. PATENT DOCUMENTS

| | | | | |
|---|---|---|---|---|
| 5,923,084 | A * | 7/1999 | Inoue | H01L 23/3121 |
| | | | | 257/E23.125 |
| 5,977,626 | A * | 11/1999 | Wang | H01L 23/49816 |
| | | | | 257/691 |
| 6,114,761 | A * | 9/2000 | Mertol | H01L 23/367 |
| | | | | 257/722 |
| 6,281,573 | B1 * | 8/2001 | Atwood | H01L 23/3675 |
| | | | | 257/710 |
| 6,369,455 | B1 * | 4/2002 | Ho | H01L 23/4334 |
| | | | | 257/730 |
| 6,396,699 | B1 | 5/2002 | Caldwell et al. | |
| 6,903,271 | B2 | 6/2005 | Pearson et al. | |

(Continued)

FOREIGN PATENT DOCUMENTS

| | | |
|---|---|---|
| KR | 10-0271637 | 11/2000 |
| KR | 10-1359669 | 2/2014 |

*Primary Examiner* — Nitin Parekh
(74) *Attorney, Agent, or Firm* — Harness, Dickey & Pierce, P.L.C.

(57) ABSTRACT

Provided is a semiconductor package comprising a lower package that includes a lower substrate and a lower semiconductor chip, an interposer substrate on the lower package and having a plurality of holes that penetrate the interposer substrate, a thermal radiation structure that includes a supporter on a top surface of the interposer substrate and a plurality of protrusions in the holes of the interposer substrate, and a thermal conductive layer between the lower semiconductor chip and the protrusions of the thermal radiation structure.

20 Claims, 15 Drawing Sheets

(56) References Cited

U.S. PATENT DOCUMENTS

| | | | |
|---|---|---|---|
| 8,217,502 B2* | 7/2012 | Ko | H01L 23/49833 |
| | | | 257/773 |
| 8,643,172 B2* | 2/2014 | Foong | H01L 23/4334 |
| | | | 257/713 |
| 9,349,713 B2 | 5/2016 | Kim et al. | |
| 9,620,484 B2 | 4/2017 | Kim | |
| 10,361,177 B2 | 7/2019 | Kim et al. | |
| 10,446,520 B2 | 10/2019 | Jeng et al. | |
| 2005/0095875 A1* | 5/2005 | Huang | H01L 23/3128 |
| | | | 257/E23.092 |
| 2014/0239479 A1* | 8/2014 | Start | H01L 21/56 |
| | | | 257/706 |
| 2015/0249065 A1* | 9/2015 | Pagaila | H01L 23/49827 |
| | | | 257/737 |
| 2019/0067258 A1* | 2/2019 | Kim | H01L 25/117 |

* cited by examiner

SEMICONDUCTOR PACKAGE

CROSS-REFERENCE TO RELATED APPLICATION

This U.S. nonprovisional application claims priority under 35 U.S.C § 119 to Korean Patent Application No. 10-2020-0164363 filed on Nov. 30, 2020 in the Korean Intellectual Property Office, the disclosure of which is hereby incorporated by reference in its entirety.

BACKGROUND

The present inventive concepts relate to a semiconductor package, and more particularly, to a semiconductor package including an interposer substrate.

A semiconductor package is provided to implement an integrated circuit chip to qualify for use in electronic products. Typically, in the semiconductor package, a semiconductor chip is mounted on a printed circuit board (PCB) and bonding wires or bumps are used to electrically connect the semiconductor chip to the printed circuit board. The higher speed and capacity of the semiconductor package, the more increase in power consumption of the semiconductor package. Accordingly, thermal characteristics and reliability of semiconductor packages are becoming increasingly important.

SUMMARY

Some example embodiments of the present inventive concepts provide a semiconductor package with increased thermal radiation properties.

Some example embodiments of the present inventive concepts provide a semiconductor package with improved reliability and a method of fabricating the same.

According to some example embodiments of the present inventive concepts, a semiconductor package may comprise: a lower package that includes a lower substrate and at least one lower semiconductor chip; an interposer substrate on the lower package, the interposer substrate having a plurality of holes that penetrate the interposer substrate; a thermal radiation structure that includes a supporter on a top surface of the interposer substrate and a plurality of protrusions in the holes of the interposer substrate; and a thermal conductive layer between the lower semiconductor chip and the protrusions of the thermal radiation structure.

According to some example embodiments of the present inventive concepts, a semiconductor package may comprise a lower package that includes a lower substrate and at least one lower semiconductor chip; an interposer substrate on the lower package, the interposer substrate having a plurality of holes that penetrate the interposer substrate; and a thermal radiation structure on the interposer substrate. The thermal radiation structure may including a plurality of first portions in the holes of the interposer substrate and vertically overlapping the lower semiconductor chip, and a plurality of second portions on a top surface of the interposer substrate and connected to the first portions. The thermal radiation structure may be spaced apart from sidewalls of the holes of the interposer substrate and from a top surface of the lower semiconductor chip.

According to some example embodiments of the present inventive concepts, a semiconductor package may comprise: a lower package that includes a lower substrate, at least one lower semiconductor chip, a lower molding layer, and a plurality of lower connection structures; an interposer substrate on the lower package, the interposer substrate having a plurality of holes that penetrate the interposer substrate, the plurality of holes overlapping the lower semiconductor chip in a plan view; an upper package on the interposer substrate, the upper package including an upper substrate and at least one upper semiconductor chip; a plurality of upper connection structures between and coupled to the upper substrate and the interposer substrate; a thermal radiation structure that includes a supporter on a top surface of the interposer substrate and protrusions in the plurality of holes; and a thermal conductive layer between the thermal radiation structure and the lower semiconductor chip, the thermal conductive layer including a material different from a material of the thermal radiation structure. The upper connection structures may be laterally spaced apart from the supporter of the thermal radiation structure.

DETAILED DESCRIPTION OF EMBODIMENTS

Figure 1A:
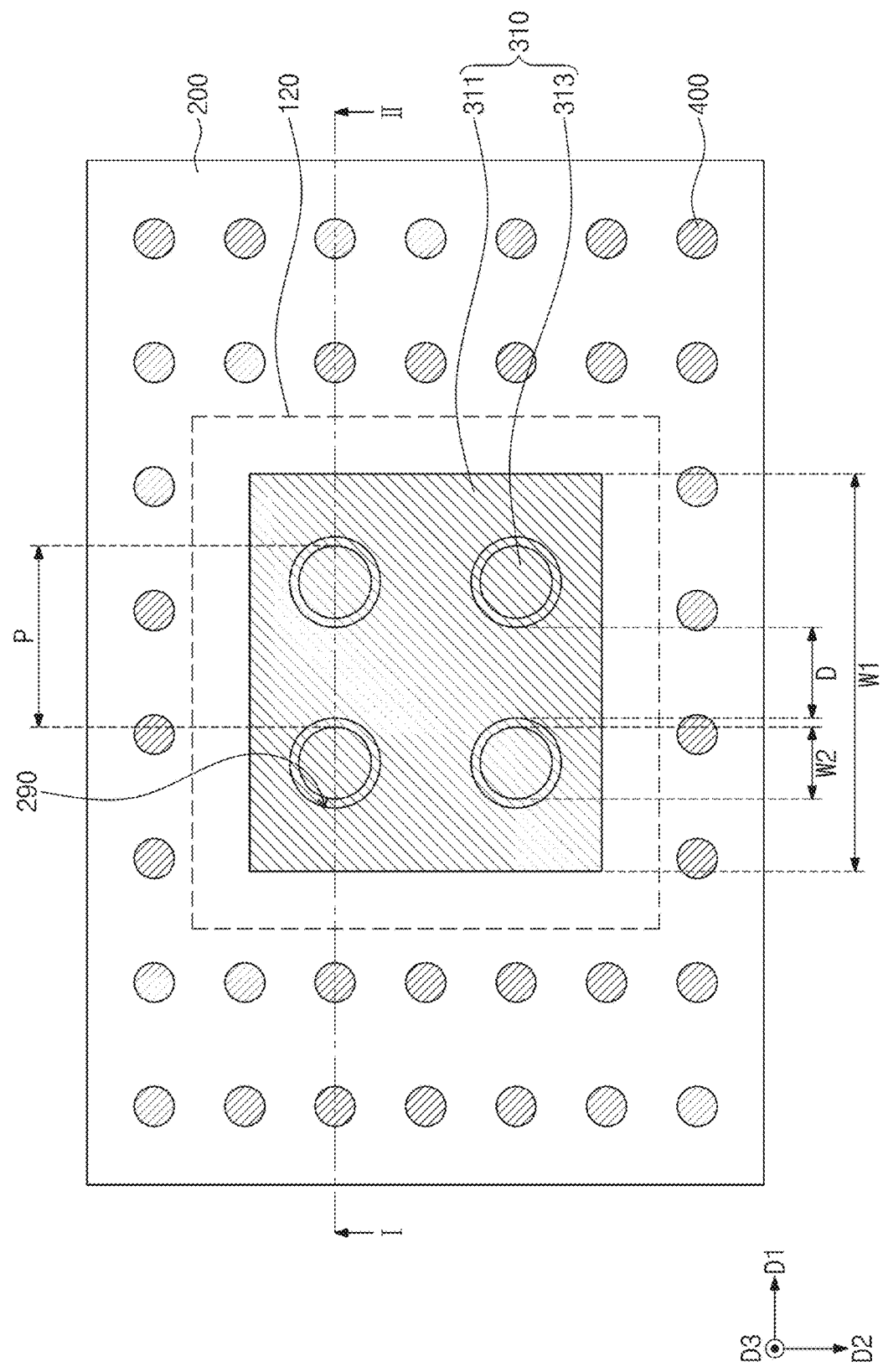
FIG. 1A illustrates a plan view showing a semiconductor package according to some example embodiments of the present inventive concepts.

In this description, although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, and/or section, from another region, layer, and/or section.

Thus, a first element, component, region, layer, and/or section, discussed below may be termed a second element, component, region, layer, and/or section, without departing from the scope of this disclosure.

Spatially relative terms, such as "laterally," "lower," "bottom," "upper," "top," and/or the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, the device may be otherwise oriented (rotated 90 degrees and/or at other orientations) and the spatially relative descriptors used herein interpreted accordingly.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Unless otherwise noted, like reference numerals may indicate like components. A semiconductor package and a method of fabricating the same according to the present inventive concepts will now be described.

Figure 1B:
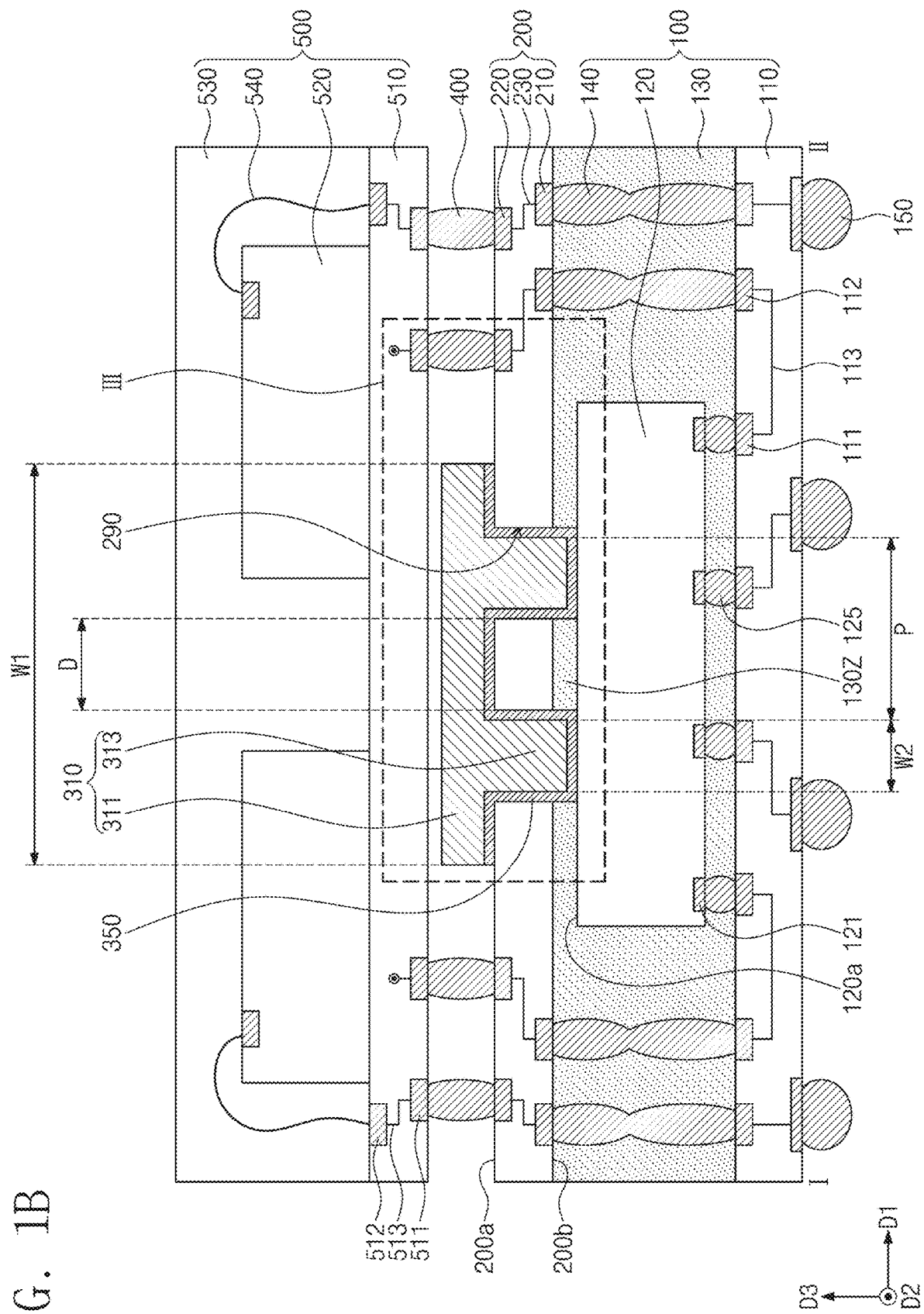
FIG. 1B illustrates a cross-sectional view taken along line I-II of FIG. 1A.
Figure 1C:
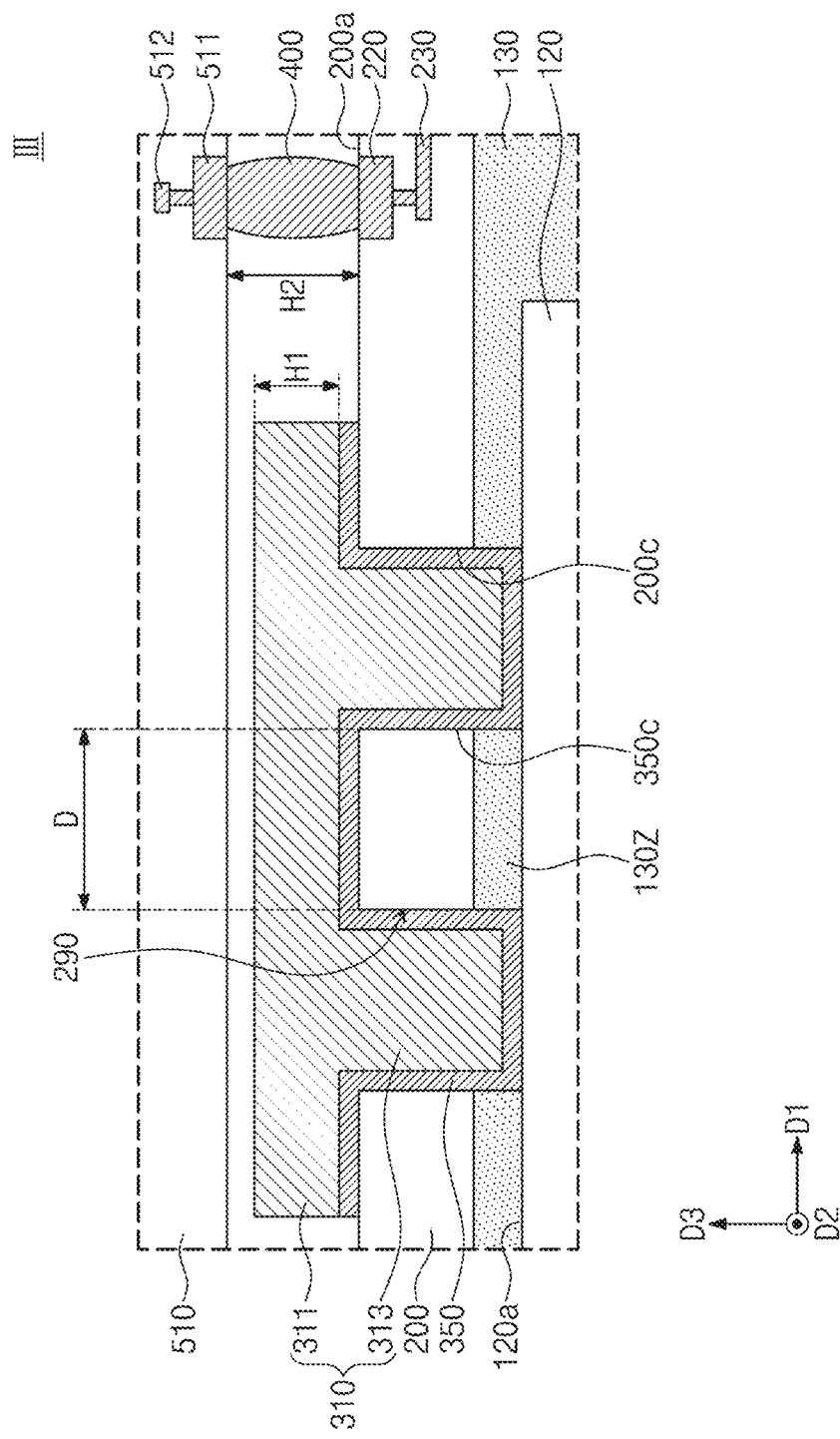
FIG. 1C illustrates an enlarged view showing section III of FIG. 1B.
Figure 2:
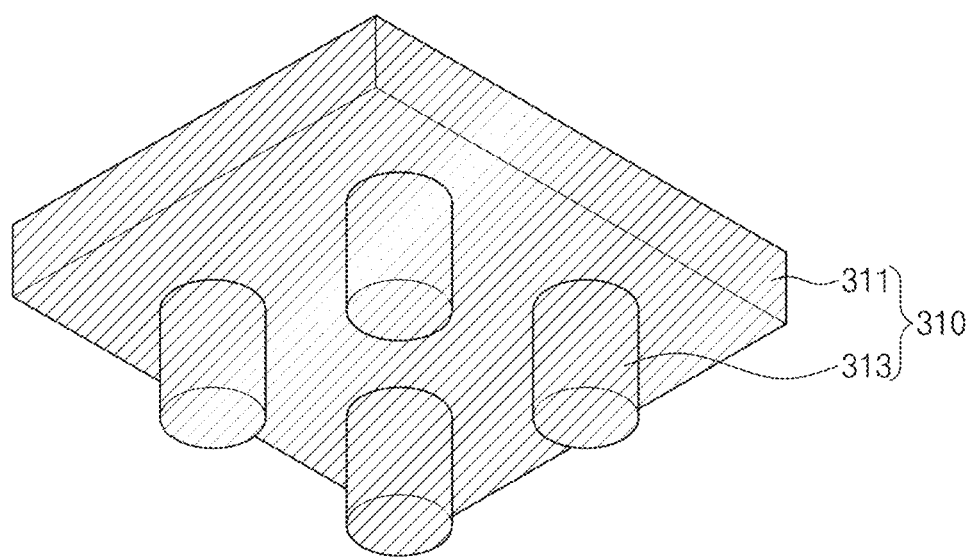
FIG. 2 illustrates a perspective view showing a thermal radiation structure according to some example embodiments.

FIG. 1A illustrates a plan view showing a semiconductor package according to some example embodiments. FIG. 1B illustrates a cross-sectional view taken along line I-II of FIG. 1A. FIG. 1C illustrates an enlarged view showing section III of FIG. 1B. FIG. 2 illustrates a perspective view showing a thermal radiation structure according to some example embodiments.

Referring to FIGS. 1A, 1B, 1C, and 2, a semiconductor package may include a lower package 100, an upper package 500, upper connection structures 400, an interposer substrate 200, a thermal radiation structure 310, and a thermal conductive layer 350. The lower package 100 may include a lower substrate 110, a lower semiconductor chip 120, a lower molding layer 130, and lower connection structures 140. In some embodiments, a printed circuit board (PCB) and/or a redistribution layer may be used as the lower substrate 110. The lower substrate 110 may include a dielectric base layer, first substrate pads 111, second substrate pads 112, and internal lines 113. When viewed in plan, the first substrate pads 111 may be disposed on a top surface at a central region of the lower substrate 110. The second substrate pads 112 may be disposed on a top surface at an edge region of the lower substrate 110. For example, the edge region of the lower substrate 110 may be provided between the central region and a lateral surface of the lower substrate 110. The first and/or second substrate pads 111 and 112 may include a conductive material like a metal, such as one or more of aluminum (Al), copper (Cu), tungsten (W), titanium (Ti), and/or an alloy thereof.

The internal lines 113 may be provided in the lower substrate 110. The internal lines 113 may be coupled to the first substrate pads 111 and/or the second substrate pads 112. For example, at least one of the first substrate pads 111 may be coupled through its corresponding internal line 113 to a corresponding second substrate pad 112. The phrase "two components are electrically connected/coupled to each other" may include the meaning that the two components are connected/coupled directly to each other or indirectly to each other through other conductive component(s). For example, the phrase "electrically connected to the lower substrate 110" may mean "electrically connected to the internal lines 113." The internal lines 113 may include a conductive material like a metal, such as one or more of aluminum (Al), copper (Cu), tungsten (W), titanium (Ti), and/or an alloy thereof. In the following drawings, the solid lines in the lower substrate 110 schematically indicate the internal lines 113.

The semiconductor package may further include solder terminals 150. The solder terminals 150 may be provided on a bottom surface of the lower substrate 110 and electrically coupled to the internal lines 113. External electrical signals may be transmitted through the solder terminals 150 to the internal lines 113. The solder terminals 150 may be electrically coupled to the first substrate pads 111 and/or the second substrate pads 112. For example, a solder terminal 150 may be electrically coupled to either a first substrate pad 111 or a second substrate pad 112 through an internal line 113. The solder terminals 150 may include conductive pads and/or solder balls, and may include a conductive material like a metal, such as a solder material. The solder material may include tin (Sn), silver (Ag), zinc (Zn), and/or an alloy thereof.

In some embodiments, the lower semiconductor chip 120 may be flip-chip bonded to the lower substrate 110. The lower semiconductor chip 120 may serve as a logic chip. For example, the lower semiconductor chip 120 may act as a non-memory chip, such as an application processor. For another example, the lower semiconductor chip 120 may be a system-on-chip. The lower semiconductor chip 120 may have integrated circuits therein and may include a logic circuit, a memory circuit, and/or a combination thereof. The lower semiconductor chip 120 may include chip pads 121 provided on a bottom surface of the lower semiconductor chip 120. The bottom surface of the lower semiconductor chip 120 may be directed toward the lower substrate 110. The chip pads 121 may be electrically connected to the integrated circuits of the lower semiconductor chip 120. Therefore, the bottom surface of the lower semiconductor chip 120 may serve as an active surface. The lower semiconductor chip 120 may have a top surface 120a that is opposite to the bottom surface; the top surface 120a may be, for example, an inactive surface. In this description, the phrase "electrically connected to a chip pad of a semiconductor chip" may also mean "electrically connected to the semiconductor chip." The expression "electrically connected to a semiconductor chip" may mean "electrically connected to integrated circuits of the semiconductor chip."

Bumps 125 may be provided between the lower substrate 110 and the lower semiconductor chip 120. For example, the bumps 125 may be electrically connected to the first substrate pads 111 and/or the chip pads 121. For example, the bumps 125 may electrically connect the first substrate pads 111 and the chip pads 121. The bumps 125 may include one or more of solders and/or pillars. The bumps 125 may include a conductive material, such as a solder material.

In some example embodiments, a thermo-compression bonding method may be used to mount the lower semiconductor chip 120 on the lower substrate 110. In this case, the lower semiconductor chip 120 may be directly in physical contact with the lower substrate 110, and the chip pads 121 may be directly coupled to corresponding first substrate pads 111.

The lower substrate 110 may be provided thereon with the lower connection structures 140 laterally spaced apart from the lower semiconductor chip 120. The phrase "laterally disposed" may mean "disposed in a first direction D1, a second direction D2, in a direction opposite to the first direction D1, and/or in a direction opposite to the second direction D2." The first direction D1 may be parallel to a top surface of the lower substrate 110. The second direction D2 may be parallel to the top surface of the lower substrate 110, while intersecting the first direction D1. A third direction D3 may be substantially perpendicular to the top surface of the lower substrate 110. When viewed in plan, the lower connection structures 140 may be disposed on the edge region of the lower substrate 110. For example, when viewed in plan, the lower connection structures 140 may be interposed between the lower semiconductor chip 120 and the lateral surface of the lower substrate 110. The lower connection structures 140 may be provided on and/or electrically coupled to corresponding second substrate pads 112. Therefore, the lower connection structures 140 may be electrically coupled (e.g., through the internal lines 113) to the lower semiconductor chip 120 and/or the solder terminals 150. The lower connection structures 140 may include a metal pillar, a solder ball, a conductive pillar, and/or a combination thereof. The lower connection structures 140 may include a conductive material, such as metal and/or solder material.

The interposer substrate 200 may be disposed on the lower package 100. For example, the interposer substrate 200 may be disposed on the lower semiconductor chip 120 and the lower connection structures 140. The interposer substrate 200 may have a top surface 200a and a bottom surface 200b that are opposite to each other. The interposer substrate 200 may include and/or be an insulator, for example, a dielectric resin and/or polymer. The dielectric resin may include a solder resist material such as photosensitive polyimide, but the present inventive concepts are not limited thereto. The dielectric polymer may be an epoxy-based molding compound, but the present inventive concepts are not limited thereto. The interposer substrate 200 may have holes 290 that penetrate the interposer substrate 200. For example, the holes 290 may penetrate the top surface 200a and the bottom surface 200b of the interposer substrate 200. When viewed in plan as shown in FIG. 1A, the holes 290 may overlap the lower semiconductor chip 120. The holes 290 may have their circular shapes when viewed in plan. Alternatively, each of the holes 290 may have a tetragonal shape, a hexagonal shape, an octagonal shape, and/or any suitable polygonal shape when viewed in plan.

The interposer substrate 200 may include lower pads 210, metal lines 230, and upper pads 220. The lower pads 210 and the upper pads 220 may be disposed respectively on the bottom surface 200b and the top surface 200a of the interposer substrate 200. The lower pads 210 and the upper pads 220 may be laterally spaced apart from the holes 290. For example, in some embodiments, the lower pads 210 and/or the upper pads 220 may be above the edge region of the lower substrate 100. The lower pads 210 may be correspondingly electrically coupled to the lower connection structures 140. The metal lines 230 may be provided in the interposer substrate 200. The upper pads 220 may be electrically connected through the metal lines 230 to the lower pads 210. At least one of the upper pads 220 may not vertically overlap the lower pad 210 electrically connected thereto. In this description, the term "vertical" or "vertically" may mean "parallel to the third direction D3." The number and arrangement of the upper pads 220 may be freely designed without being limited to the number and arrangement of the lower connection structures 140. The lower pads 210, the metal lines 230, and the upper pads 220 may include a conductive material, such as a metal.

The upper package 500 may be disposed on the interposer substrate 200. The upper package 500 may include an upper substrate 510 and an upper semiconductor chip 520. The upper substrate 510 may include first conductive pads 511, second conductive pads 512, and/or conductive lines 513. The first conductive pads 511 and the second conductive pads 512 may be disposed respectively on a bottom surface and a top surface of the upper substrate 510. The conductive lines 513 may be provided in the upper substrate 510. The second conductive pads 512 may be electrically coupled through the conductive lines 513 to the first conductive pads 511.

The upper semiconductor chip 520 may be mounted on the top surface of the upper substrate 510. For example, the upper semiconductor chip 520 may be electrically connected through bonding wires 540 to the upper substrate 510. The phrase "electrically connected to the upper substrate 510" may mean "electrically connected to at least one of the conductive lines 513." For another example, the upper semiconductor chip 520 may be flip-chip mounted on the upper substrate 510. The upper semiconductor chip 520 may have a different function from that of the lower semiconductor chip 120. For example, the upper semiconductor chip 520 may serve as a memory chip. The upper semiconductor chip 520 may be provided as a single chip and/or as part of a plurality. For example, a plurality of upper semiconductor chips 520 may be laterally spaced apart from each other and/or a plurality of upper semiconductor chips 520 may be stacked on each other. For brevity of description, the following will focus on a single upper semiconductor chip 520, but the present inventive concepts are not limited thereto.

The upper package 500 may further include an upper molding layer 530. The upper substrate 510 may be provided thereon with the upper molding layer 530 that encapsulate the bonding wires 540, a top surface of the upper semiconductor chip 520, and/or at least one sidewall of the upper semiconductor chip 520. The upper molding layer 530 may include, for example, an insulator like a dielectric polymer, such as an epoxy-based molding compound and/or solder resist material.

The upper connection structures 400 may be interposed between the upper substrate 510 and the interposer substrate 200. For example, the upper connection structure 400 may be correspondingly interposed between and electrically coupled to the upper pads 220 of the interposer substrate 200 and the first conductive pads 511 of the upper substrate 510. The upper semiconductor chips 520 may be electrically connected to the lower semiconductor chip 120 and/or the solder terminals 150 through the upper substrate 510, the upper connection structures 400, and the lower connection structures 140.

The thermal radiation structure 310 may be provided in the holes 290 and on the top surface 200a of the interposer substrate 200. The thermal radiation structure 310 may be laterally spaced apart from the upper connection structures 400. For example, in some embodiments, the thermal radiation structure 310 may be disposed above the central region of the lower substrate 110. The thermal radiation structure 310 may include a thermally conductive material like a metal, such as copper (Cu), aluminum (Al), and/or an alloy thereof. For example, a metal plate may be processed to manufacture the thermal radiation structure 310.

The thermal radiation structure 310 may include a supporter 311 and protrusions 313. The protrusions 313 of the thermal radiation structure 310 may be provided in corresponding holes 290 of the interposer substrate 200. Therefore, the protrusions 313 may have their bottom surfaces at a lower level than that of the top surface 200a of the interposer substrate 200. In this description, the language "level" may indicate "vertical level," and the expression "difference in level" may be measured in a direction parallel to the third direction D3. Because the protrusions 313 of the thermal radiation structure 310 are disposed in the holes 290 of the interposer substrate 200, the semiconductor package may become small in size even when the thermal radiation structure 310 is provided. The protrusions 313 may be spaced apart from corresponding sidewalls of the holes 290. The sidewalls of the holes 290 may correspond to inner walls (200c of FIG. 1C) of the interposer substrate 200. The protrusions 313 may be spaced apart from the top surface 120a of the lower semiconductor chip 120. Therefore, the bottom surfaces of the protrusions 313 may be located at a higher level than that of the top surface 120a of the lower semiconductor chip 120. Each of the protrusions 313 may have, for example, a cylindrical shape, but are not limited thereto. For example, the protrusions 313 may have various shapes that without limitation to that shown in FIGS. 1A and 2. In some embodiments, when viewed in plan, each of the protrusions 313 may have a shape that matches the corresponding hole 290. For example, the protrusions 313 may have a tetragonal shape, a hexagonal shape, an octagonal shape, and/or any suitable polygonal shape. The protrusions 313 may, when viewed in plan, be arranged along the first direction D1 and the second direction D2. The planar arrangement of the protrusions 313 is not limited to that shown, but may be variously changed. For example, the protrusions 313 may be arranged in a honeycomb or zigzag shape. The protrusions 313 may be first portions of the thermal radiation structure 310.

The supporter 311 of the thermal radiation structure 310 may be disposed on the top surface 200a of the interposer substrate 200. The supporter 311 may be laterally spaced apart from the upper connection structures 400. When viewed in plan as shown in FIG. 1A, the supporter 311 may be disposed on a central region of the interposer substrate 200, and the upper connection structures 400 may be disposed on an edge region of the interposer substrate 200. For example, the upper connection structures 400 may be provided between the supporter 311 and a sidewall of the interposer substrate 200. When viewed in plan, the upper connection structures 400 may be disposed to enclose the supporter 311.

As shown in FIGS. 1B and 1C, the supporter 311 may be provided on and connected to the protrusions 313. For example, the supporter 311 and the protrusions 313 may include the same material and/or may be connected with no boundary therebetween. The supporter 311 may have a width W1 greater than that of each of the protrusions 313. The width W1 of the supporter 311 may correspond to a width at a top surface of the thermal radiation structure 310. In some embodiments, the width W1 of the supporter 311 may range, for example, from about 30 μm to about 500 μm. Because the width W1 of the supporter 311 is equal to or less than about 500 μm, the thermal radiation structure 310 may impose no limitation on an arrangement of the upper connection structures 400. The supporter 311 may be spaced apart from the top surface 200a of the interposer substrate 200 and the bottom surface of the upper substrate 510. The supporter 311 may have a top surface at a higher level than that of the top surface 200a of the interposer substrate 200. The supporter 311 may have a top surface at a lower level than that of the bottom surface of the upper substrate 510. The supporter 311 may be a second portion of the thermal radiation structure 310. Though illustrated as a tetragonal block, the supporter 311 is not so limited, and may be and/or include different shapes. In some embodiments, at least one surface of the supporter 311 may be textured to increase the surface area of the supporter 311, thereby increasing the heat dissipation from the thermal radiation structure 310

When the semiconductor package operates, a relatively large amount of heat may be generated from the lower semiconductor chip 120. For example, the amount of heat generated from the lower semiconductor chip 120 may be larger than that of heat produced from the upper semiconductor chip 520. The higher thermal radiation characteristics of the lower semiconductor chip 120, the greater improvement in thermal properties of the semiconductor package. When the upper package 500 has a heat sink and/or a heat slug on a top surface thereof, the heat sink or the heat slug may have difficulty in receiving the heat generated from the lower semiconductor chip 120. According to some example embodiments, because the thermal radiation structure 310 is disposed on the lower semiconductor chip 120, the heat generated from the lower semiconductor chip 120 may not travel to the upper package 500, but propagate to the thermal radiation structure 310. Therefore, the heat generated from the lower semiconductor chip 120 may be promptly discharged to improve the thermal properties of the semiconductor package. According to some example embodiments, because the width W1 of the supporter 311 is equal to or greater than about 30 μm, the lower semiconductor chip 120 may actively improve in thermal radiation characteristics. According to some embodiments, the upper package 500 may include one or more stacks of upper semiconductor chips 520. In this case, for example, wherein the semiconductor chips 520 include a memory chip, a logic chip, a buffer chip, a controller chip, an application processor chip, an interposer chip, and/or a combination thereof, thermal radiation structures 310 and/or thermal conductive layers 350 may be disposed between some and/or all of the semiconductor chips 520 such that heat generated in the stack of semiconductor chips 520 may be dissipated without traveling to an upper and/or lateral edge of the upper package 500.

The upper connection structures 400 may be provided with pressure and heat in a mounting process of the upper package 500. In this case, the pressure may compel at least two of the upper connection structures 400 to contact each other to induce an electrical short between the at least two of the upper connection structures 400. According to some example embodiments, because the supporter 311 is provided to the thermal radiation structure 310, the upper connection structures 400 may be prevented from receiving excessive pressure in a mounting process of the upper package 500. Therefore, the occurrence of electrical short may be prevented between the upper connection structures 400, and the semiconductor package may increase in reliability. An air gap may and/or may not exist between an upper surface of the supporter 311 and a lower surface of the upper substrate 510.

As illustrated in FIG. 1C, the supporter 311 may have a height H1 about 0.7 times to about 0.9 times a height H2 of each of the upper connection structures 400. Because the height H1 of the supporter 311 is equal to or greater than about 0.7 times the height H2 of each upper connection structure 400, the lower connection structures 140 may be effectively prevented from receiving excessive pressure in a mounting process of the upper package 500. Because the height H1 of the supporter 311 is equal to or less than about 0.9 times the height H2 of each upper connection structure 400, the semiconductor package may become compact-sized.

When a single hole 290 is provided in the interposer substrate 200, it may be required that the hole 290 have a relatively large width to sufficiently discharge heat from the lower semiconductor chip 120. In this case, it may be difficult to handle the interposer substrate 200 in semiconductor package fabrication. According to some example embodiments, the interposer substrate 200 may have a plurality of holes 290, and it may be possible to adjust a width of the holes 290 and an interval D between two neighboring holes 290. Therefore, the interposer substrate 200 may be easily handled. The interval D between neighboring holes 290 of the interposer substrate 200 may range from about 30 μm to about 50 μm. Because the interval D between neighboring holes 290 of the interposer substrate 200 is equal to or greater than about 30 μm, the interposer substrate 200 may be more easily handled.

As a plurality of protrusions 313 are provided in corresponding holes 290 of the interposer substrate 200, the heat generated from the lower semiconductor chip 120 may be promptly discharged through the plurality of protrusions 313. Because the interval D between neighboring holes 290 of the interposer substrate 200 is equal to or less than about 50 μm, the lower semiconductor chip 120 may be provided with the sufficient number of the protrusions 313. Accordingly, the lower semiconductor chip 120 may effectively improve in thermal radiation properties.

The protrusions 313 may have a pitch P greater than a width W2 of each of the protrusions 313. For example, a value of about 20 μm to about 50 μm may be given as a difference between the pitch P and the width W2 of the protrusions 313. The difference between the pitch P and the width W2 of the protrusions 313 may be greater than the interval D between two neighboring holes 290 of the interposer substrate 200.

The thermal conductive layer 350 may be provided between the thermal radiation structure 310 and the lower semiconductor chip 120 and/or between the thermal radiation structure 310 and the interposer substrate 200. For example, the thermal conductive layer 350 may be provided in a first gap between the top surface 120a of the lower semiconductor chip 120 and the bottom surface of each protrusion 313 of the thermal radiation structure 310, thereby filling the first gap. The thermal conductive layer 350 may have a thermal conductivity greater than that of air. Because the thermal conductive layer 350 is provided in the first gap, the thermal radiation structure 310 may promptly receive, through the thermal conductive layer 350, the heat generated from the lower semiconductor chip 120 when the semiconductor package operates. The thermal conductive layer 350 may be provided in a second gap between the protrusions 313 and the sidewalls of the holes 290 of the interposer substrate 200 (e.g., the inner walls 200c of the interposer substrate 200) and/or in a third gap between the supporter 311 and the interposer substrate 200, thereby filling the second gap and the third gap. In each of the holes 290, the thermal conductive layer 350 may have an outer wall 350c in physical contact with the interposer substrate 200, and the lower molding layer 130.

The thermal conductive layer 350 may include a different material from that of the thermal radiation structure 310. For example, a solder paste material may be used to form the thermal conductive layer 350. In this case, the thermal conductive layer 350 may include a conductive material, such as tin, lead, silver, and/or any alloy thereof. Alternatively, the thermal conductive layer 350 may include a thermal interface material (TIM). The thermal interface material may include, for example, a polymer and thermal conductive particles. The thermal conductive particles may be distributed in the polymer. The thermal conductive particles may include metal. The thermal conductive layer 350 may be in a solid state.

The lower molding layer 130 may be provided in a gap between the lower substrate 110 and the interposer substrate 200. The lower molding layer 130 may encapsulate the lower substrate 110, the top surface 120a and a sidewall of the lower semiconductor chip 120, and/or sidewalls of the lower connection structures 140. For example, the lower molding layer 130 may be in physical contact with a bottom surface of the interposer substrate 200. For example, no empty space may be provided between a top surface of the lower molding layer 130 and the bottom surface of the interposer substrate 200. When the empty space is provided, air and/or moisture may occupy the empty space. In contrast, according to some example embodiments, the lower molding layer 130 may protect the lower connection structures 140 against exposure to external air. The lower connection structures 140 may thus be prevented from being damaged due to external moisture or impurities, and, as a result, the semiconductor package may increase in reliability. The lower molding layer 130 may include an insulator like a dielectric polymer, such as an epoxy-molding compound (EMC), and/or a dielectric resin, such as a photosensitive polyimide.

The lower molding layer 130 may include an extension 130Z. The extension 130Z may extend between the top surface 120a of the lower semiconductor chip 120 and the bottom surface of the interposer substrate 200. The extension 130Z may be in contact with the top surface 120a of the lower semiconductor chip 120 and the bottom surface of the interposer substrate 200. The extension 130Z of the lower molding layer 130 may be in physical contact with the outer wall 350c of the thermal conductive layer 350. The extension 130Z may have sidewalls that are vertically aligned with corresponding holes 290 of the interposer substrate 200.

The lower molding layer 130 may further be provided in a gap between the lower substrate 110 and the lower semiconductor chip 120, thereby encapsulating the bumps 125. Alternatively, an under-fill layer (not shown) may be provided in a gap between the lower substrate 110 and the lower semiconductor chip 120, thereby encapsulating the bumps 125. The under-fill layer may include a dielectric polymer and/or resin.

The interposer substrate 200 may have a width substantially the same as that of the lower package 100 and that of the upper package 500. Differently from that shown, the interposer substrate 200 may have a width substantially the same as that of the lower package 100 and less than that of the upper package 500. For example, the relationship between the widths of the interposer substrate 200, the lower package 100, and the upper package 500 may be variously changed.

FIGS. 3A to 3D illustrate enlarged cross-sectional views showing a lower package, an interposer substrate, a thermal conductive layer, and a thermal radiation structure according to some example embodiments. A duplicate description will be omitted below.

Referring to FIGS. 3A to 3D, the supporter 311 of the thermal radiation structure 310 may be disposed on the top surface 200a of the interposer substrate 200, and the protrusions 313 of the thermal radiation structure 310 may be provided in corresponding holes 290 of the interposer substrate 200. The protrusions 313 of the thermal radiation structure 310 may be connected to the supporter 311 of the thermal radiation structure 310. The protrusions 313 may protrude from the supporter 311 toward the lower semiconductor chip 120. The bottom surfaces of the protrusions 313 may correspond to a bottom surface of the thermal radiation structure 310. The thermal conductive layer 350 may be provided in a first gap between the top surface 120a of the lower semiconductor chip 120 and the bottom surfaces of the protrusions 313, thereby covering the top surface 120a of the lower semiconductor chip 120. The thermal conductive layer 350 may be disposed in many ways. The following will describe in detail the arrangement of the thermal conductive layer 350 according to some example embodiments.

Figure 3A:
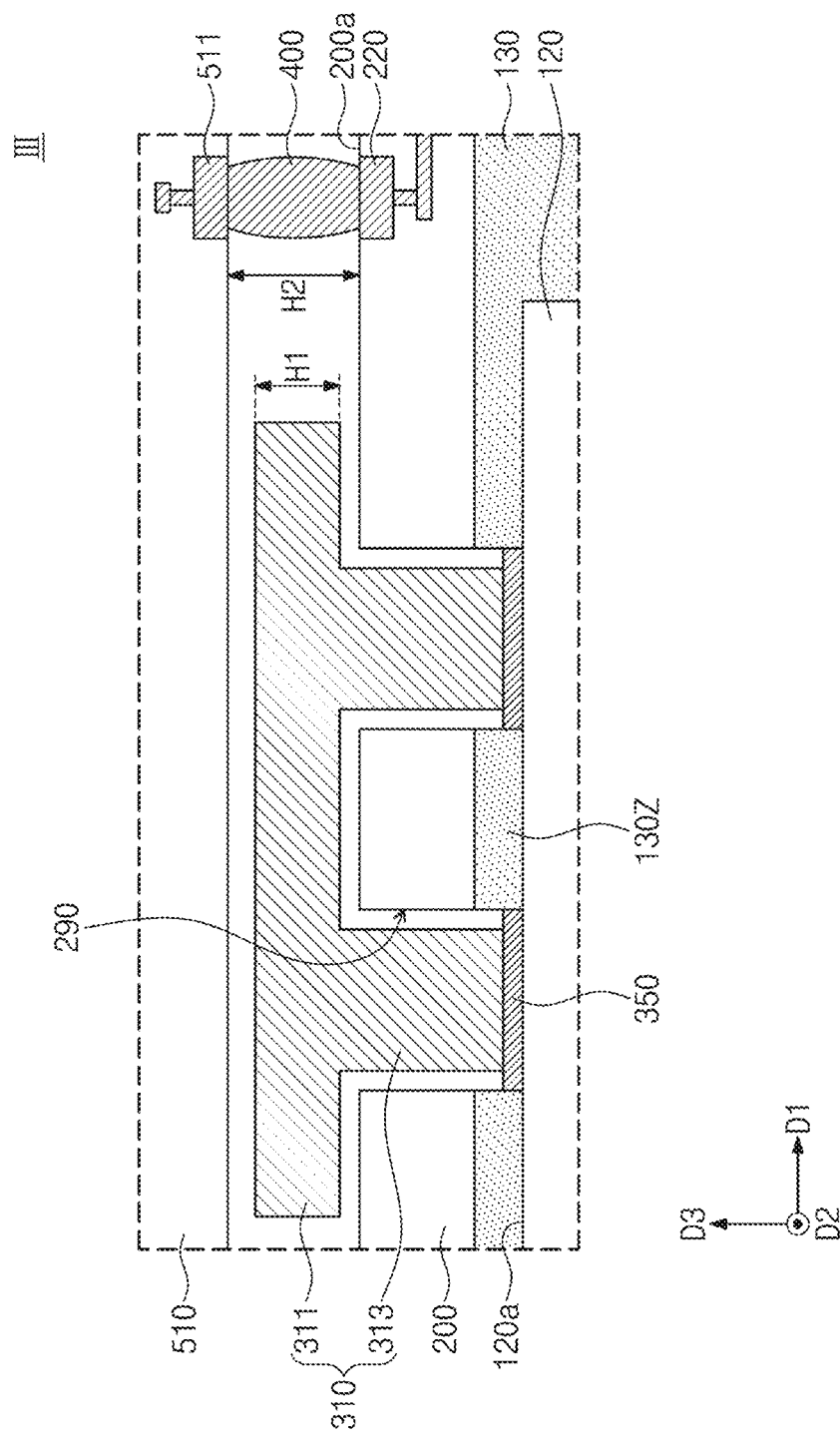
FIG. 3A illustrates a cross-sectional view showing a lower package, an interposer substrate, a thermal conductive layer, and a thermal radiation structure according to some example embodiments.

As shown in FIG. 3A, the thermal conductive layer 350 may not extend onto the sidewalls of the holes 290 of the interposer substrate 200 and/or the sidewalls of the protrusions 313. For example, as illustrated, the thermal conductive layer 350 may contact and/or wet the sidewalls of the holes 290 of the interposer substrate 200 but may not extend onto the sidewalls of the holes 290.

Figure 3B:
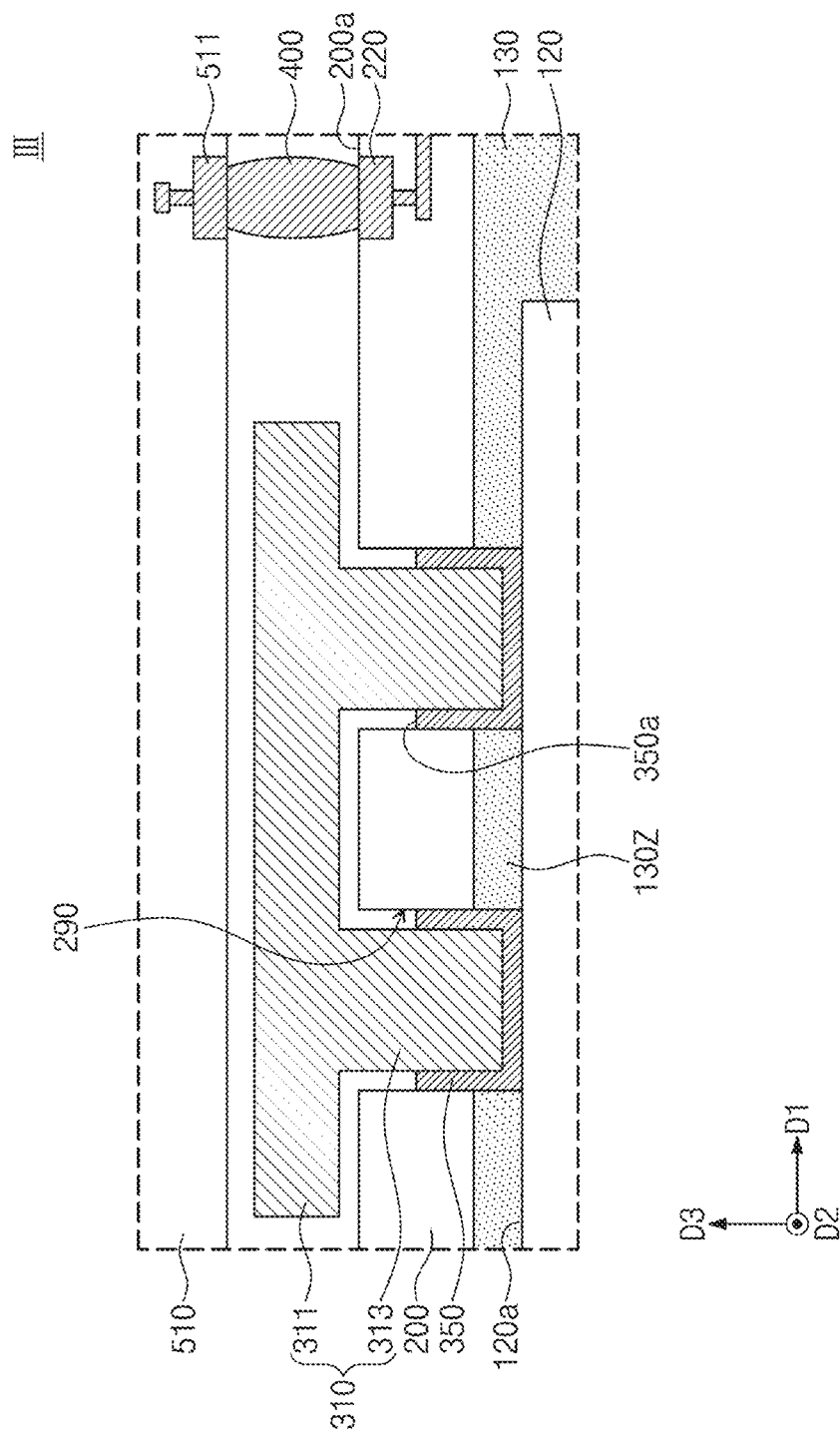
FIG. 3B illustrates a cross-sectional view showing a lower package, an interposer substrate, a thermal conductive layer, and a thermal radiation structure according to some example embodiments.

As illustrated in FIG. 3B, the thermal conductive layer 350 may fill the first gap and may further extend between a corresponding protrusion 313 and the sidewall of the hole 290. The thermal conductive layer 350 may have an uppermost surface 350a at a lower level than that of the top surface 200a of the interposer substrate 200.

Figure 3C:
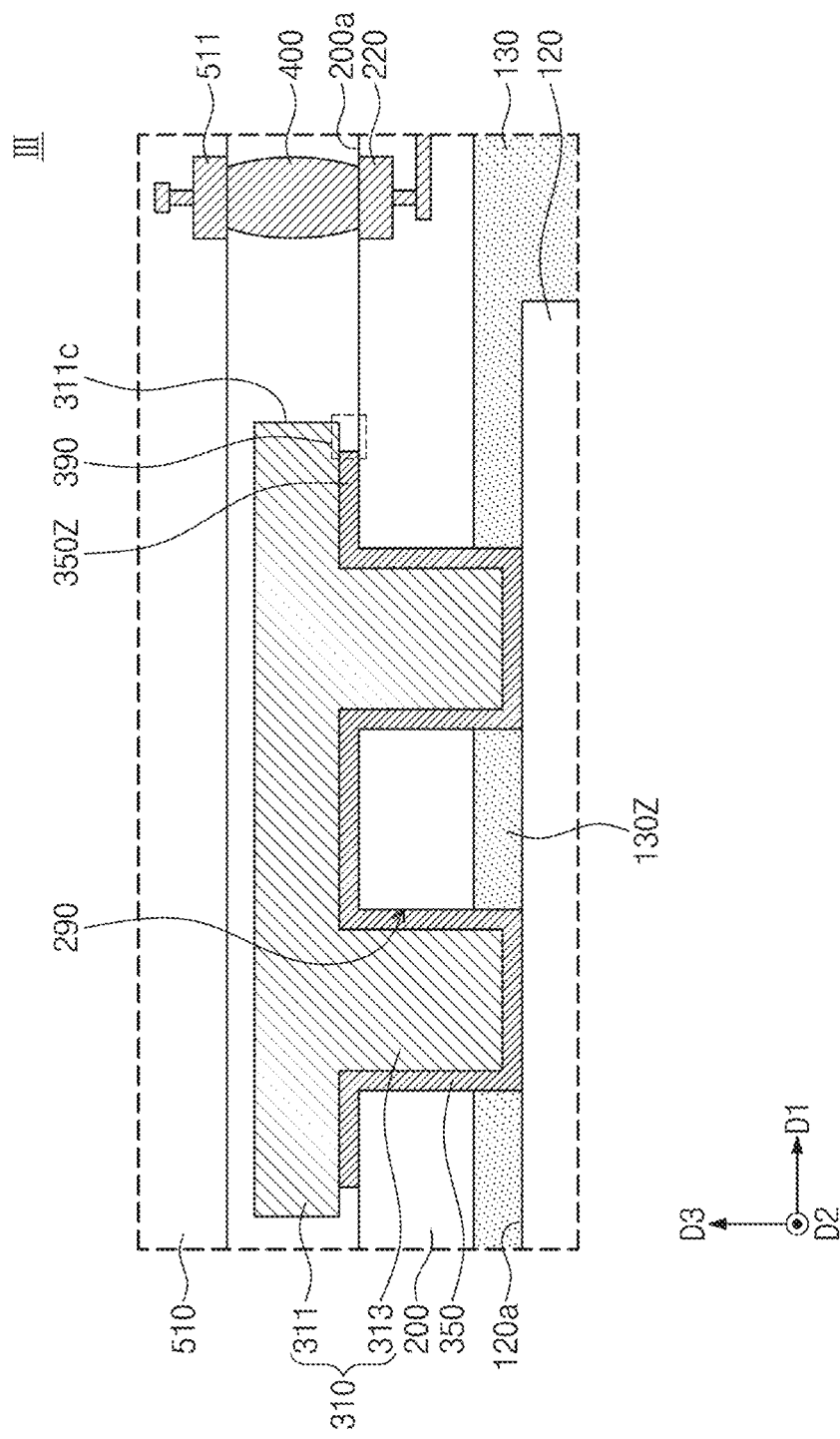
FIG. 3C illustrates a cross-sectional view showing a lower package, an interposer substrate, a thermal conductive layer, and a thermal radiation structure according to some example embodiments.

As depicted in FIG. 3C, the thermal conductive layer 350 may be provided in the first gap and in second gaps between the sidewalls of the holes 290 and the protrusions 313, and may further extend into a third gap between the top surface 200a of the interposer substrate 200 and the bottom surface of the supporter 311. The thermal conductive layer 350 may have an end portion 350Z disposed between the top surface 200a of the interposer substrate 200 and the bottom surface of the supporter 311. An undercut region 390 may be provided between the top surface 200a of the interposer substrate 200 and the bottom surface of the supporter 311. The undercut region 390 may, for example, expose the end portion 350Z of the thermal conductive layer 350. The undercut region 390 may be spatially connected to the outside, and air may be provided in the undercut region 390.

Figure 3D:
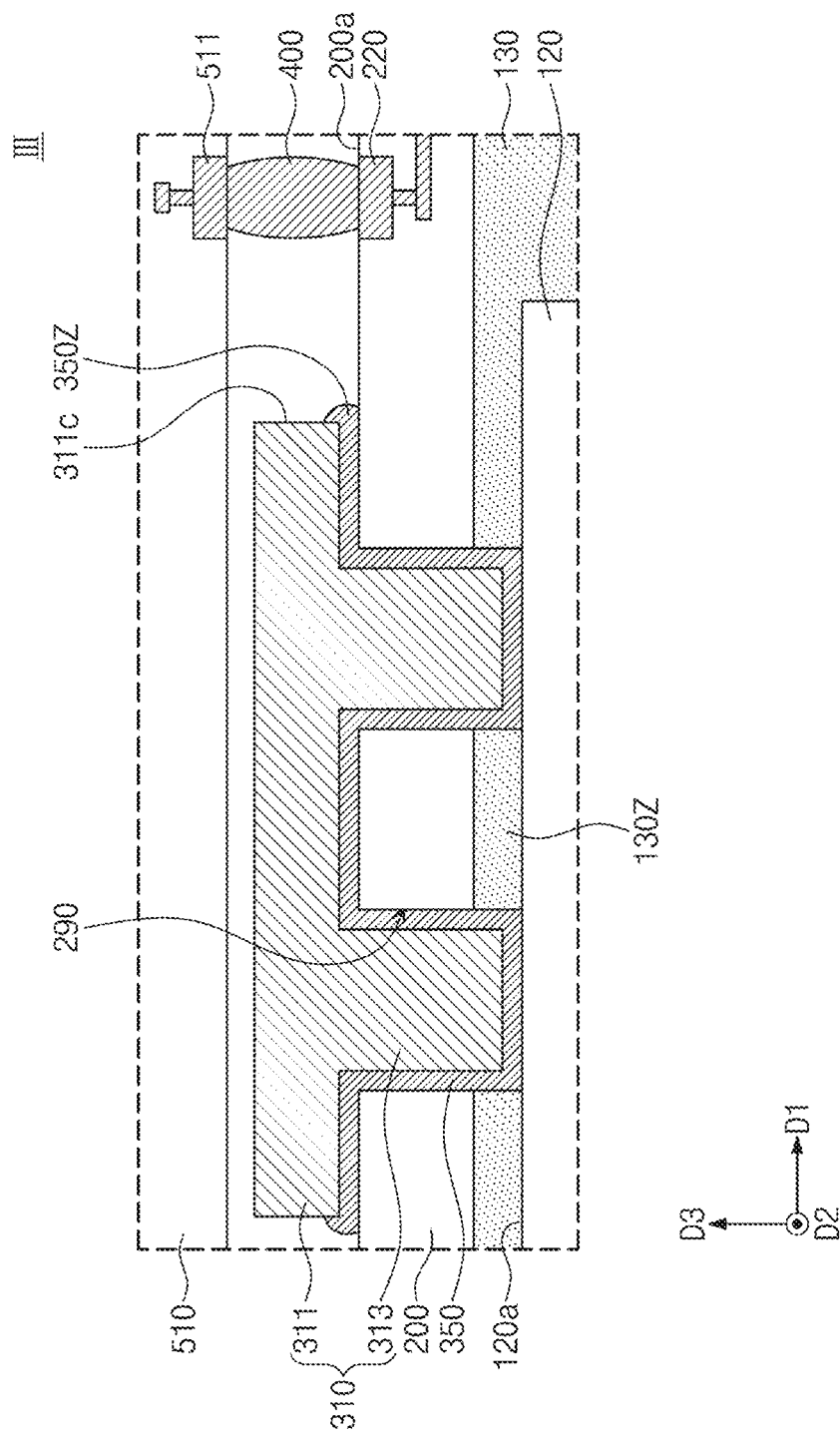
FIG. 3D illustrates a cross-sectional view showing a lower package, an interposer substrate, a thermal conductive layer, and a thermal radiation structure according to some example embodiments.

As disclosed in FIG. 3D, the thermal conductive layer 350 may be provided between the protrusions 313 and the lower semiconductor chip 120, between the protrusions 313 and the interposer substrate 200, and between the supporter 311 and the interposer substrate 200. The thermal conductive layer 350 may have an end portion 350Z provided outside an outer wall 311c of the supporter 311. For example, the thermal conductive layer 350 may further cover at least a portion of the outer wall 311c of the supporter 311.

Figure 4A:
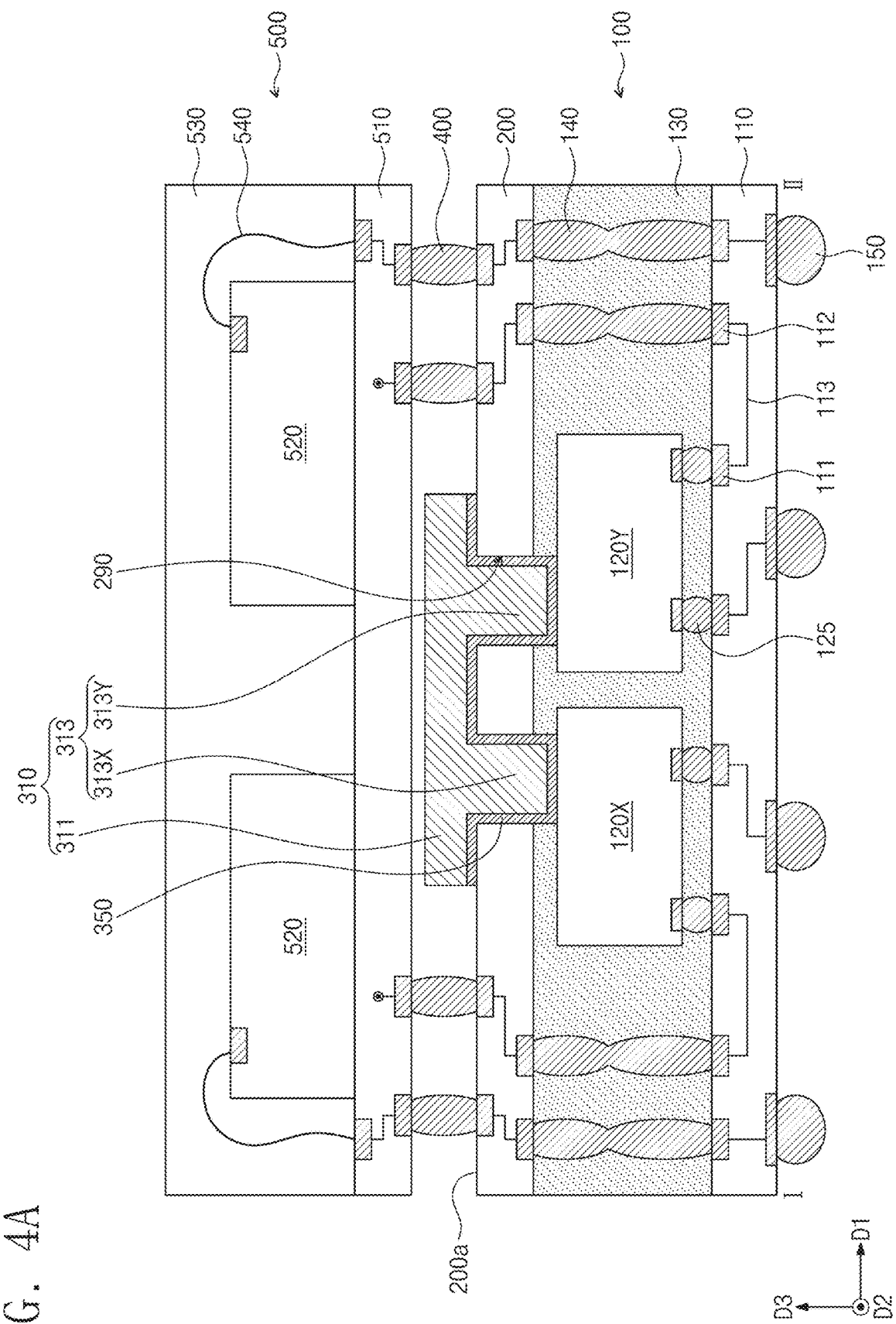
FIG. 4A illustrates a cross-sectional view showing a semiconductor package according to some example embodiments.

FIG. 4A illustrates a cross-sectional view taken along line I-II of FIG. 1A, showing a semiconductor package according to some example embodiments.

Referring to FIG. 4A, a semiconductor package may include a lower package 100, an upper package 500, an interposer substrate 200, upper connection structures 400, a thermal radiation structure 310, and a thermal conductive layer 350.

The lower package 100 may include a lower substrate 110, a plurality of lower semiconductor chips 120, a lower molding layer 130, and lower connection structures 140. The plurality of lower semiconductor chips 120 may include a first lower semiconductor chip 120X and a second lower semiconductor chip 120Y that are laterally spaced apart from each other. Each of the first and second lower semiconductor chips 120X and 120Y may be substantially the same as the lower semiconductor chip 120 discussed in the example of FIGS. 1A to 1C. For example, the first and second lower semiconductor chips 120X and 120Y may be electrically connected through the bumps 125 to the lower substrate 110.

The holes 290 may penetrate through the interposer substrate 200. When viewed in plan, some of the holes 290 may overlap the first lower semiconductor chip 120X and/or others of the holes 290 of the interposer substrate 200 may overlap the second lower semiconductor chip 120Y.

The thermal radiation structure 310 may have protrusions 313 that include a first protrusion 313X and a second protrusion 313Y. The first protrusions 313X may be disposed on a top surface of the first lower semiconductor chip 120X, and the second protrusion 313Y may be disposed on a top surface of the second lower semiconductor chip 120Y. The thermal radiation structure 310 may have a supporter 311 that is disposed on a top surface 200a of the interposer substrate 200, the first protrusion 313X, and the second protrusion 313Y and is connected to the first protrusion 313X and the second protrusion 313Y.

The thermal conductive layer 350 may be interposed between the first lower semiconductor chip 120X and the first protrusion 313X and between the second lower semiconductor chip 120Y and the second protrusion 313Y. The thermal conductive layer 350 may further extend between the thermal radiation structure 310 and inner walls of holes 290 of the interposer substrate 200. The thermal conductive layer 350 may further be provided between the thermal radiation structure 310 and the top surface 200a of the interposer substrate 200. Though illustrated as filling the first, second, and thirds gaps, as described above, the thermal conductive layer 350 is not so limited and may, for example, be and/or include at least one of the thermal conductive layers 350 of FIGS. 3A to 3D.

The thermal conductive layer 350 and the thermal radiation structure 310 may be used to externally discharge heat generated from the first lower semiconductor chip 120X and the second lower semiconductor chip 120Y.

Figure 4B:
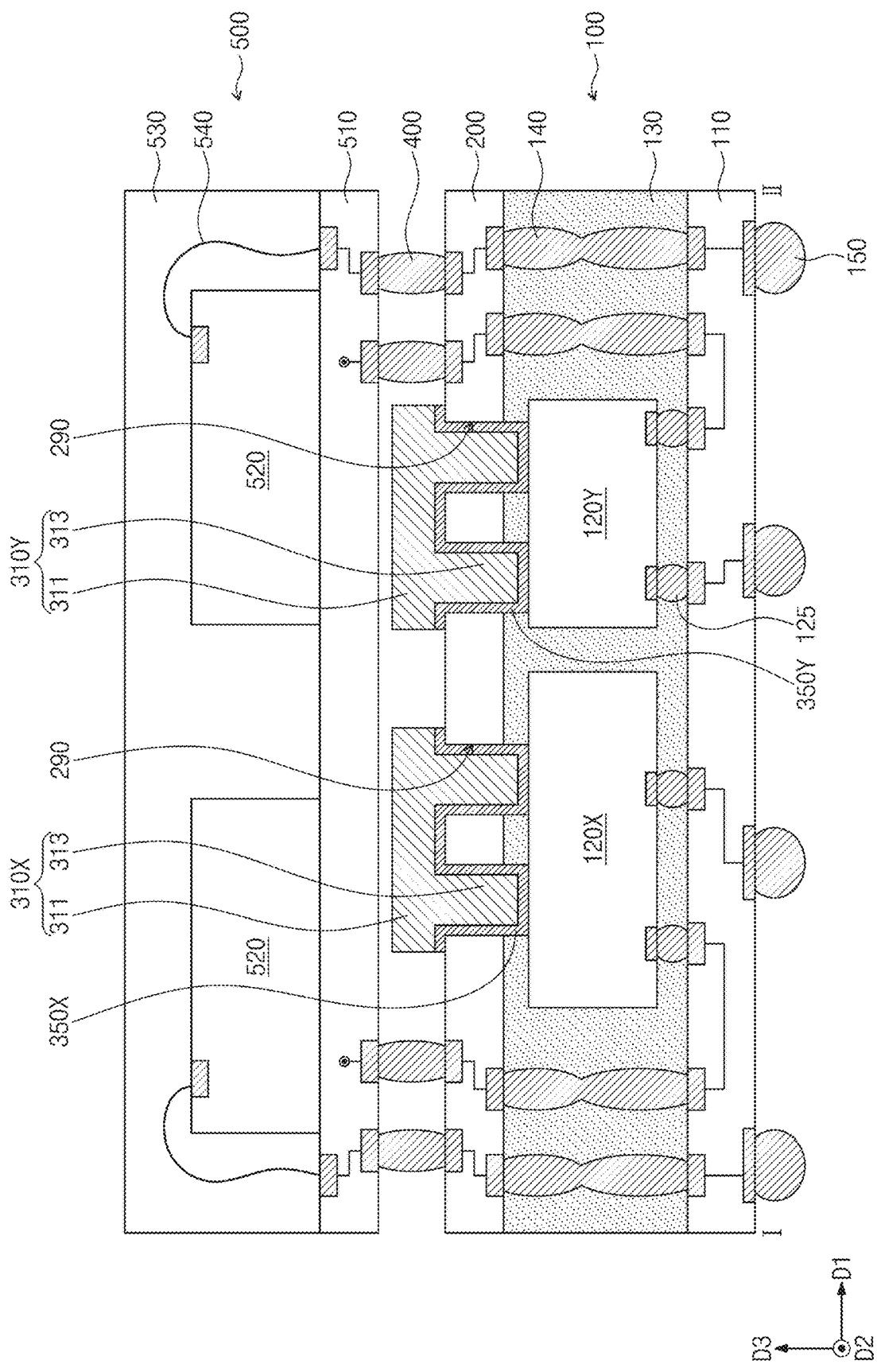
FIG. 4B illustrates a cross-sectional view showing a semiconductor package according to some example embodiments.

FIG. 4B illustrates a cross-sectional view taken along line I-II of FIG. 1A, showing a semiconductor package according to some example embodiments.

Referring to FIG. 4B, a semiconductor package may include a lower package 100, an upper package 500, an interposer substrate 200, upper connection structures 400, a first thermal radiation structure 310X, a second thermal radiation structure 310Y, a first thermal conductive layer 350X, and a second thermal conductive layer 350Y. The lower package 100 may include a lower substrate 110, a plurality of lower semiconductor chips 120 (e.g., a first lower semiconductor chip 120X and a second lower semiconductor chip 120Y), a lower molding layer 130, and lower connection structures 140. Each of the plurality of lower semiconductor chips 120 (e.g., first and second lower semiconductor chips 120X and 120Y) may vertically overlap corresponding holes 290.

The first thermal radiation structure 310X may be disposed on the first lower semiconductor chip 120X, and the second thermal radiation structure 310Y may be disposed on the second lower semiconductor chip 120Y. The second thermal radiation structure 310Y may be laterally spaced apart from the first thermal radiation structure 310X. Each of the first and second thermal radiation structures 310X and 310Y may be substantially the same as the thermal radiation structure 310 discussed in the example of FIGS. 1A to 1C. For example, each of the first and second thermal radiation structures 310X and 310Y may include a supporter 311 and protrusions 313.

The first thermal conductive layer 350X may be interposed between the first thermal radiation structure 310X and the first lower semiconductor chip 120X. The first thermal conductive layer 350X may further extend between the first thermal radiation structure 310X and the interposer substrate 200. The second thermal conductive layer 350Y may be interposed between the second thermal radiation structure 310Y and the second lower semiconductor chip 120Y. The second thermal conductive layer 350Y may further extend between the second thermal radiation structure 310Y and the interposer substrate 200. Each of the first and second thermal conductive layers 350X and 350Y may be substantially the same as the thermal conductive layer 350 discussed in the example of FIGS. 1A to 1C and/or 3A to 3D.

Figure 4C:
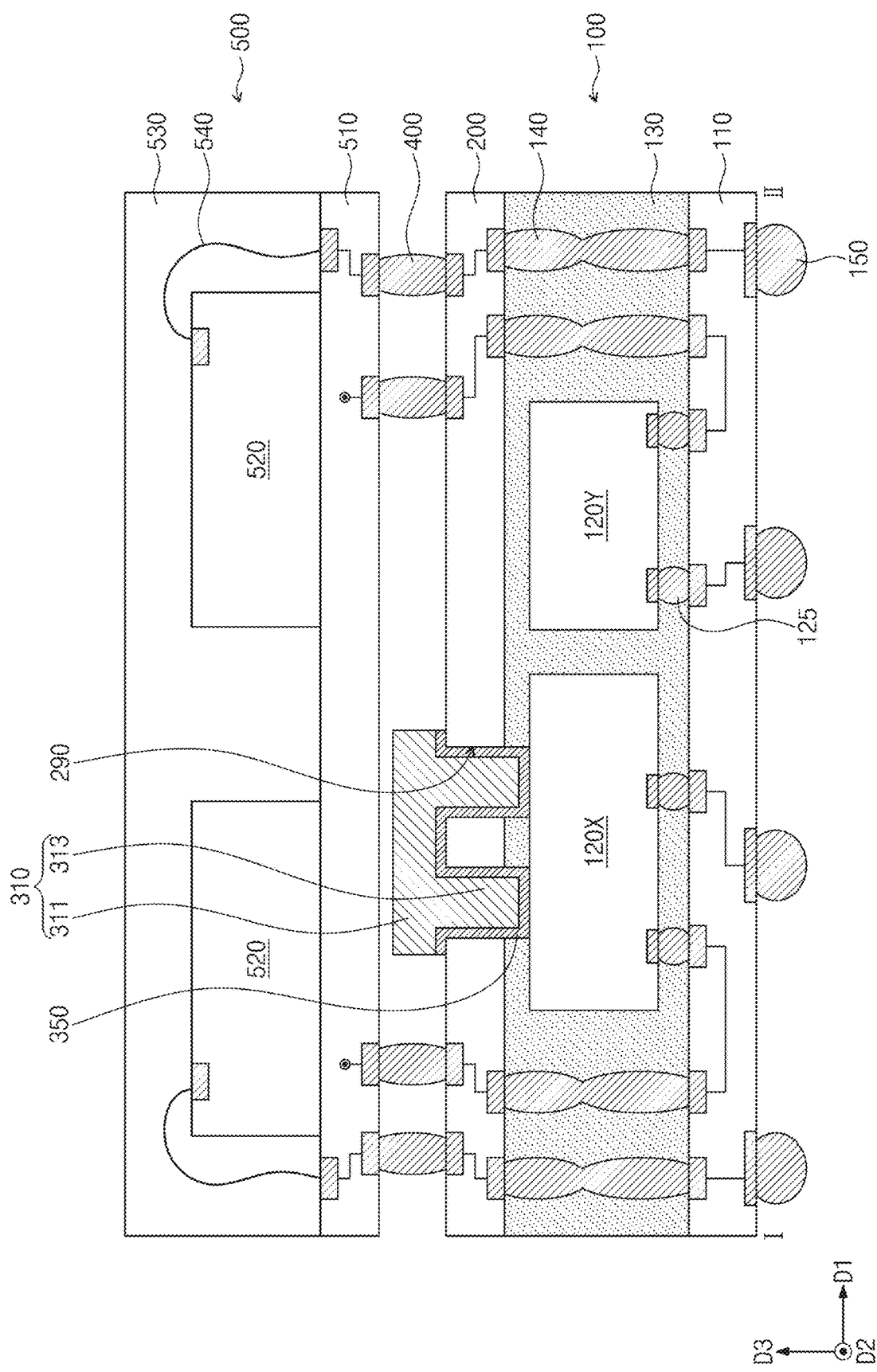
FIG. 4C illustrates a cross-sectional view showing a semiconductor package according to some example embodiments.

FIG. 4C illustrates a cross-sectional view taken along line I-II of FIG. 1A, showing a semiconductor package according to some example embodiments.

Referring to FIG. 4C, a semiconductor package may include a lower package 100, an upper package 500, an interposer substrate 200, upper connection structures 400, a thermal radiation structure 310, and a thermal conductive layer 350. The lower package 100 may include a lower substrate 110, a plurality of lower semiconductor chips 120 (e.g., a first lower semiconductor chip 120X and a second lower semiconductor chip 120Y), a lower molding layer 130, and lower connection structures 140. The first lower semiconductor chip 120X and the second lower semiconductor chip 120Y may be substantially the same as those discussed in FIGS. 4A and/or 4B. In contrast, the first lower semiconductor chip 120X may be of a different type from that of the second lower semiconductor chip 120Y. For example, the first lower semiconductor chip 120X may be a logic chip, an application processor chip, or a system-on-chip, and/or the second lower semiconductor chip 120Y may include a power management integrated circuit (PMIC) and may serve as a power management chip. When the semiconductor package operates, a large amount of heat may be generated from the first lower semiconductor chip 120X. For example, in this case, the first lower semiconductor chip 120X may generate a larger amount of heat than the second lower semiconductor chip 120Y.

The interposer substrate 200 may have holes 290, and when viewed in plan, the holes 290 may overlap the first lower semiconductor chip 120X and may not overlap the second lower semiconductor chip 120Y.

The thermal radiation structure 310 may be disposed on the interposer substrate 200 and in the holes 290. The thermal radiation structure 310 may include protrusions 313 disposed on a top surface of the first lower semiconductor chip 120X. The thermal conductive layer 350 may be interposed between the thermal radiation structure 310 and the first lower semiconductor chip 120X and between the thermal radiation structure 310 and the interposer substrate 200. Neither the thermal radiation structure 310 nor the thermal conductive layer 350 may be provided on a top surface of the second lower semiconductor chip 120Y.

The embodiments of a semiconductor package may be combined with each other. For example, there may be a combination of at least two selected from the embodiment of FIGS. 1A to 1C, the embodiment of FIG. 3A, the embodiments of FIG. 3B, the embodiment of FIG. 3C, the embodiment of FIG. 4A, the embodiment of FIG. 4B, and the embodiment of FIG. 4C.

FIGS. 5A to 5D illustrate cross-sectional views taken along line I-II of FIG. 1A, showing a method of fabricating a semiconductor package according to some example embodiments.

Figure 5A:
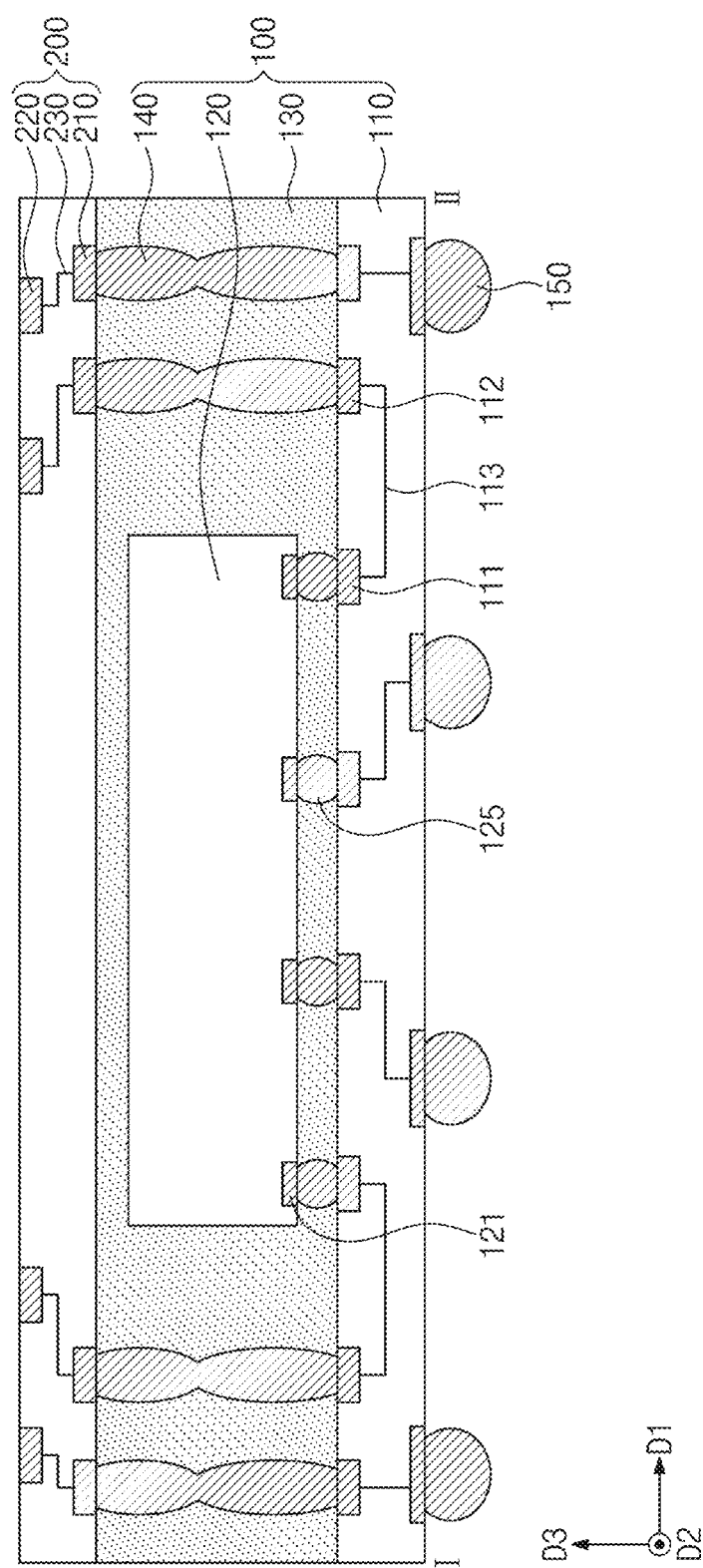
FIGS. 5A to 5D illustrate cross-sectional views showing a method of fabricating a semiconductor package according to some example embodiments.

Referring to FIG. 5A, a lower package 100 may be prepared. The lower package 100 may include a lower substrate 110, at least one lower semiconductor chip 120, a lower molding layer 130, and lower connection structures 140 that are discussed in FIGS. 1A to 1C.

An interposer substrate 200 may be disposed on the lower package 100. The interposer substrate 200 may include lower pads 210, metal lines 230, and upper pads 220. The lower pads 210 may be coupled to corresponding lower connection structures 140. A bottom surface of the interposer substrate 200 may be in physical contact with a top surface of the lower molding layer 130. No empty space may be separately provided between the bottom surface of the interposer substrate 200 and the top surface of the lower molding layer 130.

Figure 5B:
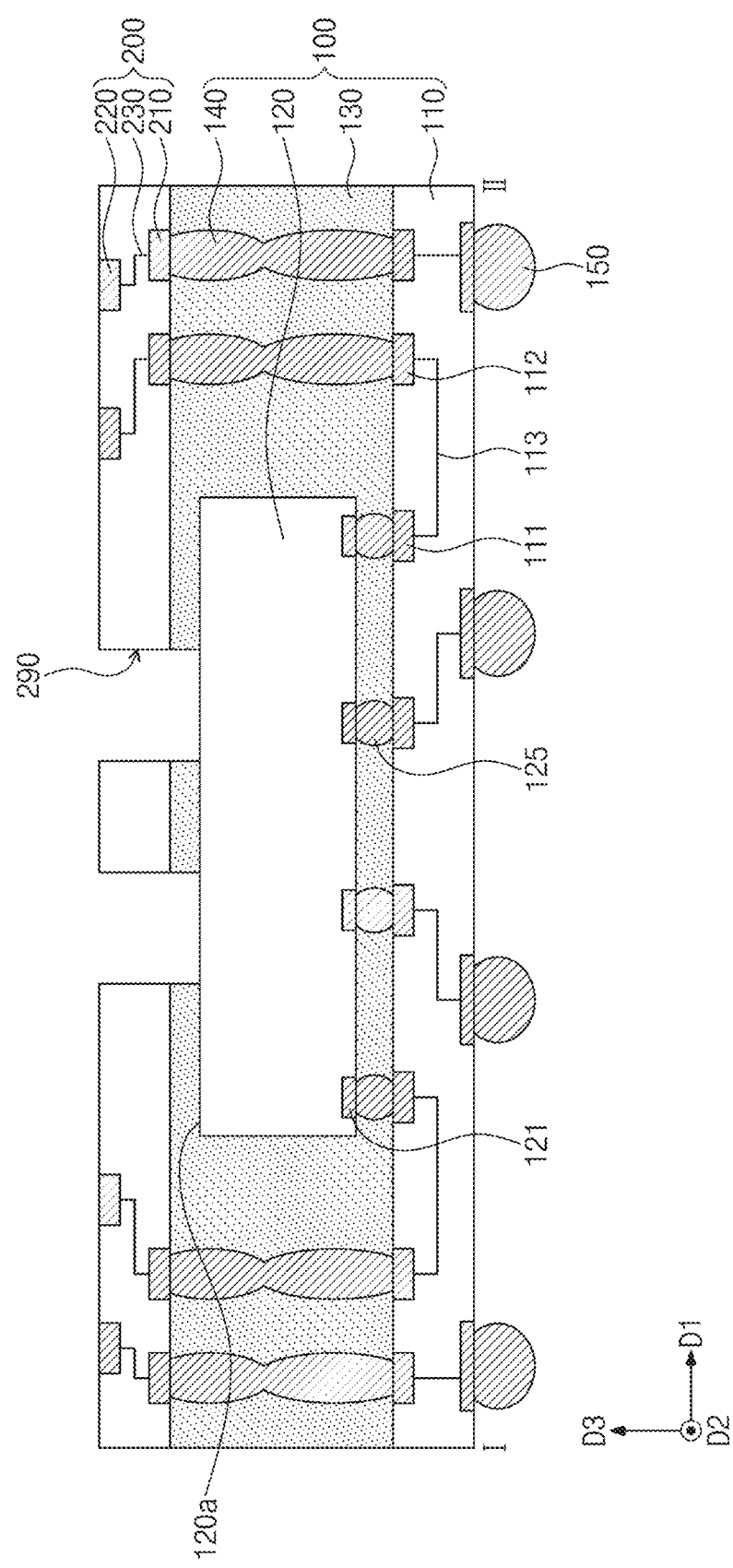

Referring to FIG. 5B, holes 290 may be formed in the interposer substrate 200 and/or the lower molding layer 130. The formation of the holes 290 may include performing a milling, drilling, and/or etching process to remove a portion of the interposer substrate 200. In this step, the holes 290 may further extend into the lower molding layer 130 to expose a top surface 120a of the lower semiconductor chip 120. For example, the formation of the holes 290 may continue until the top surface 120a of the lower semiconductor chip 120 is exposed.

Alternatively, after the preparation of the interposer substrate 200 in which the holes 290 are formed, the interposer substrate 200 may be disposed on the lower molding layer 130 and the lower connection structures 140. Portions of the lower molding layer 130 exposed to the holes 290 may be removed to allow the holes 290 to expose the top surface 120a of the lower semiconductor chip 120.

Figure 5C:
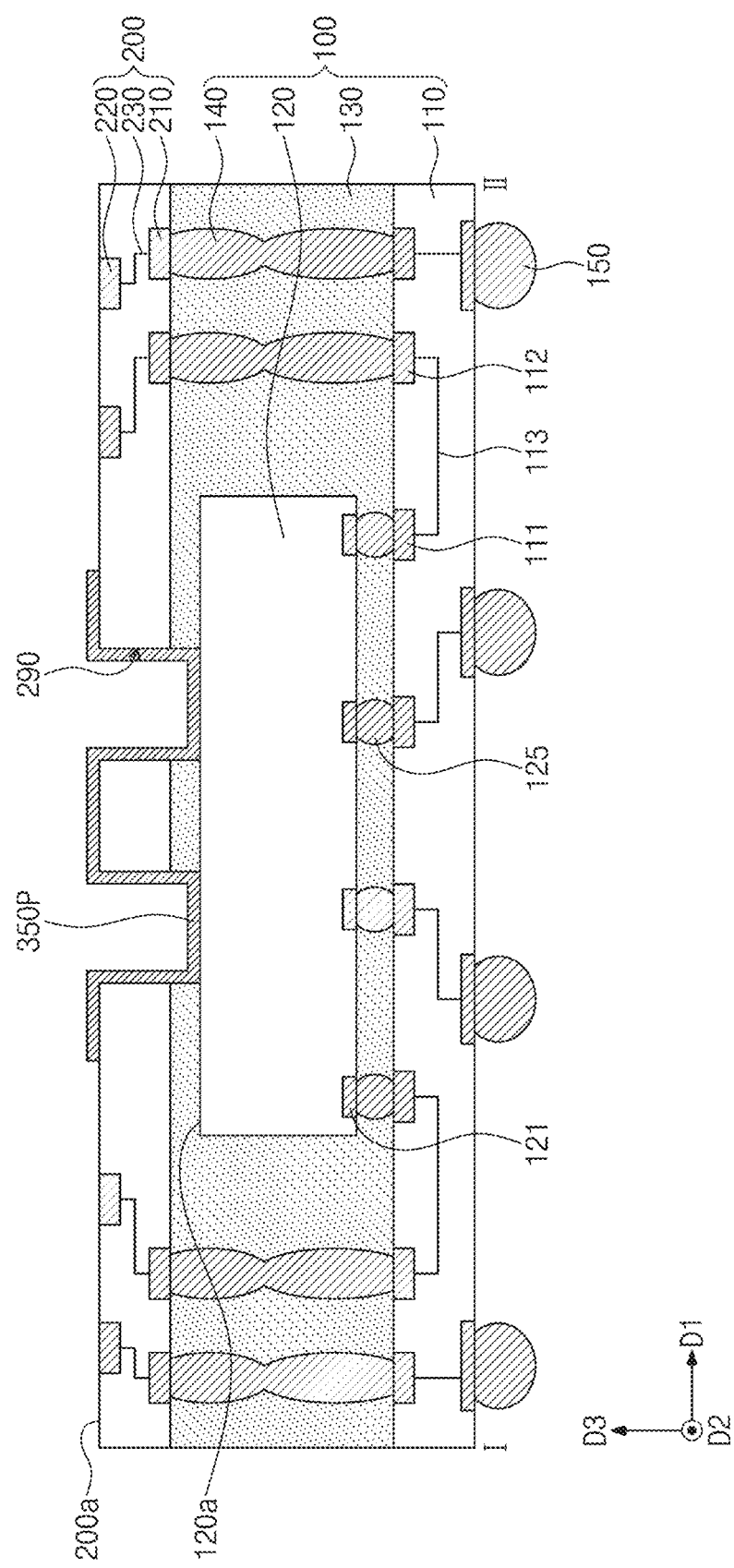

Referring to FIG. 5C, a preliminary thermal conductive layer 350P may be formed in the holes 290 of the interposer substrate 200. The preliminary thermal conductive layer 350P may cover the top surface 120a of the lower semiconductor chip 120. In some embodiments, the preliminary thermal conductive layer 350P may further extend onto sidewalls of the holes 290 and/or a top surface 200a of the interposer substrate 200. The preliminary thermal conductive layer 350P may have fluidity (e.g., be malleable, a semi-liquid, and/or a liquid). For example, the formation of the preliminary thermal conductive layer 350P may include providing the holes 290 with a solder paste material. For another example, the holes 290 may be provided with a thermal interface material to form the preliminary thermal conductive layer 350P.

Figure 5D:
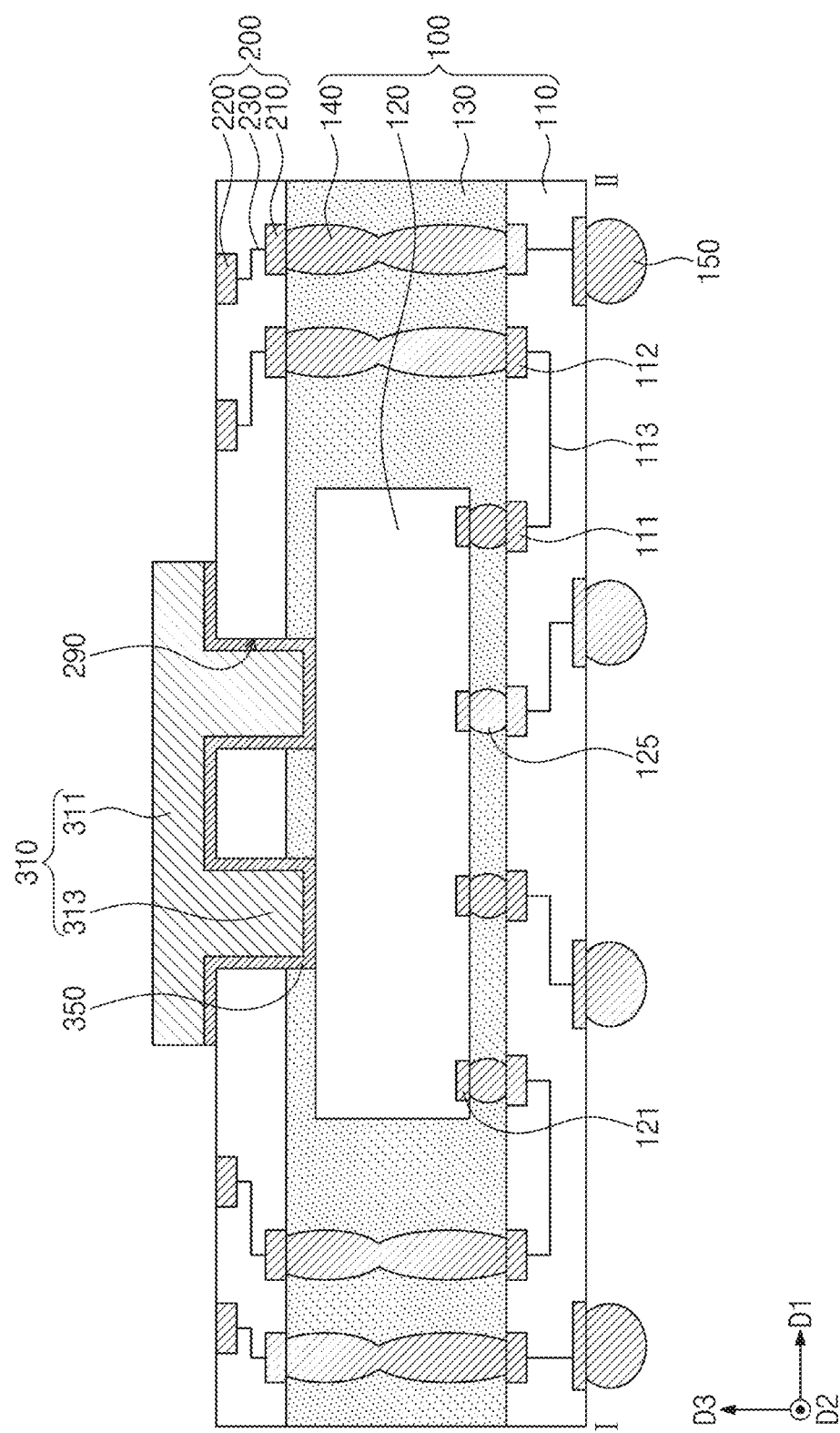

Referring to FIG. 5D, a thermal radiation structure 310 may be disposed on the interposer substrate 200. For example, there may be prepared the thermal radiation structure 310 that includes a supporter 311 and protrusions 313 shown in FIG. 2. The thermal radiation structure 310 may be disposed on the interposer substrate 200, and the protrusions 313 of the thermal radiation structure 310 may be aligned with the holes 290 of the interposer substrate 200. The thermal radiation structure 310 may descend to provide the holes 290 with the protrusions 313. In this step, because the preliminary thermal conductive layer 350P has fluidity, the preliminary thermal conductive layer 350P may satisfactorily fill a first gap between the thermal radiation structure 310 and the lower semiconductor chip 120. The preliminary thermal conductive layer 350P may further fill a gap between the thermal radiation structure 310 and the interposer substrate 200. Afterwards, the preliminary thermal conductive layer 350P may be solidified to form a thermal conductive layer 350. The formation of the thermal conductive layer 350 may include curing a polymer included in the preliminary thermal conductive layer 350P, but the present inventive concepts are not limited thereto.

Referring back to FIG. 1B, an upper package 500 may be mounted on the interposer substrate 200. The mounting of the upper package 500 may include placing the upper package 500 on the interposer substrate 200 and forming upper connection structures 400 between the upper package 500 and the interposer substrate 200. A reflow process may cause the upper connection structures 400 to correspondingly couple to the upper pads 220 of the interposer substrate 200. The upper connection structure 400 may physically and/or electrically connect the upper package 500 to the interposer substrate 200. Differently from the discussion of FIG. 5D, the solidification of the preliminary thermal conductive layer 350P may be executed during the reflow process of the upper connection structures 400, and thus the thermal conductive layer 350 may be formed.

The processed mentioned above may fabricate a semiconductor package.

According to the present inventive concepts, because a thermal radiation structure is provided on a lower semiconductor chip, a semiconductor package may improve in thermal characteristics. The thermal radiation structure may include a supporter and protrusions. The protrusions of the thermal radiation structure are provided in corresponding holes of an interposer substrate, and thus the semiconductor package may become small in size. The supporter of the thermal radiation structure may be disposed on a top surface of the interposer substrate, and thus during a process in which an upper package is mounted, upper connection structures may be prevented from being in physical contact with each other. Accordingly, the semiconductor package may increase in reliability.

This detailed description of the present inventive concepts should not be construed as limited to the embodiments set forth herein, and it is intended that the present inventive concepts cover the various combinations, the modifications, and variations of this invention without departing from the spirit and scope of the present inventive concepts. The appended claims should be construed to include other embodiments.

What is claimed is:

1. A semiconductor package, comprising:
   a lower package including a lower substrate and at least one lower semiconductor chip;
   an interposer substrate on the lower package, the interposer substrate including a plurality of holes that penetrate the interposer substrate;
   a thermal radiation structure including a supporter on a top surface of the interposer substrate and a plurality of protrusions in the holes of the interposer substrate; and
   a thermal conductive layer between the lower semiconductor chip and the protrusions of the thermal radiation structure.

2. The semiconductor package of claim 1, wherein the thermal conductive layer includes a material different from a material of the thermal radiation structure.

3. The semiconductor package of claim 2, wherein the thermal conductive layer includes at least one of a solder paste material or a thermal interface material.

4. The semiconductor package of claim 1, wherein
   the lower package further includes a lower molding layer between the lower substrate and the interposer substrate,
   the lower molding layer includes an extension, and
   the extension is between a top surface of the lower semiconductor chip and a bottom surface of the interposer substrate.

5. The semiconductor package of claim 4, wherein the extension of the lower molding layer is in physical contact with the thermal conductive layer.

6. The semiconductor package of claim 4, wherein sidewalls of the holes of the interposer substrate are aligned with sidewalls of the extension of the lower molding layer.

7. The semiconductor package of claim 4, wherein the lower molding layer is in physical contact with the bottom surface of the interposer substrate.

8. The semiconductor package of claim 1, wherein the thermal conductive layer is further between the thermal radiation structure and the interposer substrate.

9. The semiconductor package of claim 1, further comprising:
   an upper package on the interposer substrate and the thermal radiation structure; and
   an upper connection structure between the interposer substrate and the upper package,
   wherein the upper connection structure is laterally spaced apart from the thermal radiation structure.

10. The semiconductor package of claim 9, wherein a height of the supporter is about 0.7 times to about 0.9 times a height of the upper connection structure.

11. The semiconductor package of claim 1, wherein an interval, in a lateral direction, between neighboring two of the holes is in a range of about 20 μm to about 50 μm.

12. The semiconductor package of claim 1, wherein a width of the supporter, in a lateral direction, is in a range of about 30 μm to about 500 μm.

13. The semiconductor package of claim 1, wherein, when viewed in plan, the holes of the interposer substrate overlap the at least one lower semiconductor chip.

14. A semiconductor package, comprising:
   a lower package including a lower substrate and at least one lower semiconductor chip;
   an interposer substrate on the lower package, the interposer substrate including a plurality of holes that penetrate the interposer substrate; and
   a thermal radiation structure on the interposer substrate, the thermal radiation structure including
      a plurality of first portions in the holes of the interposer substrate and vertically overlapping the lower semiconductor chip, and
      at least one second portions on a top surface of the interposer substrate and connected to the first portions,
   wherein the thermal radiation structure is spaced apart from sidewalls of the holes of the interposer substrate and from a top surface of the lower semiconductor chip.

15. The semiconductor package of claim 14, further comprising:

a thermal conductive layer between the lower semiconductor chip and the first portions of the thermal radiation structure,
wherein the thermal conductive layer includes a material different from a material of the thermal radiation structure.

16. The semiconductor package of claim 15, wherein
the lower package further includes a lower molding layer between the lower substrate and the interposer substrate,
the lower molding layer includes an extension between the lower semiconductor chip and the interposer substrate, and
the extension of the lower molding layer is in physical contact with an outer wall of the thermal conductive layer.

17. The semiconductor package of claim 14, further comprising:
an upper substrate on the interposer substrate and the thermal radiation structure; and
an upper connection structure between the interposer substrate and the upper substrate,
wherein a height of the second portions is about 0.7 times to about 0.9 times a height of the upper connection structure.

18. A semiconductor package, comprising:
a lower package including a lower substrate, at least one lower semiconductor chip, a lower molding layer, and a plurality of lower connection structures;
an interposer substrate on the lower package, the interposer substrate including a plurality of holes that penetrate the interposer substrate, the plurality of holes overlapping the lower semiconductor chip in a plan view;
an upper package on the interposer substrate, the upper package including an upper substrate and at least one upper semiconductor chip;
a plurality of upper connection structures between and coupled to the upper substrate and the interposer substrate;
a thermal radiation structure including a supporter on a top surface of the interposer substrate and protrusions in the plurality of holes; and
a thermal conductive layer between the thermal radiation structure and the lower semiconductor chip, the thermal conductive layer including a material different from a material of the thermal radiation structure,
wherein the upper connection structures are laterally spaced apart from the supporter of the thermal radiation structure.

19. The semiconductor package of claim 18, wherein
bottom surfaces of the protrusions are at a level lower than a level of the top surface of the interposer substrate, and
the level of the bottom surfaces of the protrusions are higher than a level of a top surface of the at least one lower semiconductor chip.

20. The semiconductor package of claim 18, wherein
the lower molding layer is between the lower substrate and the interposer substrate,
the lower molding layer extends between a top surface of the at least one lower semiconductor chip and a bottom surface of the interposer substrate, and
the lower molding layer is in physical contact with the thermal conductive layer.

* * * * *